US005517753A

United States Patent [19]

Messina

[11] Patent Number: 5,517,753
[45] Date of Patent: May 21, 1996

[54] ADJUSTABLE SPACER FOR FLAT PLATE COOLING APPLICATIONS

[75] Inventor: Gaetano P. Messina, Hopewell Junction, N.Y.

[73] Assignee: International Business Machines Corporation, Armonk, N.Y.

[21] Appl. No.: 418,644

[22] Filed: Apr. 6, 1995

[51] Int. Cl.$^6$ .................................................. H05K 3/30
[52] U.S. Cl. ............................................. 29/841; 29/832
[58] Field of Search ............ 29/832, 841; 257/706–711, 257/718, 719; 361/707, 709, 710, 711, 713, 717, 728, 820; 437/902, 215, 205

[56] References Cited

U.S. PATENT DOCUMENTS

| | | | |
|---|---|---|---|
| 4,322,737 | 3/1982 | Sliwa, Jr. ................................ | 357/82 |
| 4,500,945 | 2/1985 | Lipschutz ............................... | 361/386 |
| 4,654,966 | 4/1987 | Kohara et al. .......................... | 29/840 |
| 4,709,301 | 11/1987 | Yamaguti ................................. | 361/387 |
| 4,724,611 | 2/1988 | Hagihara ................................. | 29/840 |
| 4,987,478 | 1/1991 | Braun et al. ............................ | 357/81 |
| 5,098,609 | 3/1992 | Iruvanti et al. ........................ | 252/511 |
| 5,155,661 | 10/1992 | Nagesh et al. .......................... | 361/386 |
| 5,168,344 | 12/1992 | Ehlert et al. .......................... | 257/693 |
| 5,177,667 | 1/1993 | Graham et al. ......................... | 361/385 |
| 5,239,200 | 8/1993 | Messina et al. ........................ | 257/714 |
| 5,294,830 | 3/1994 | Young et al. ........................... | 257/714 |
| 5,304,969 | 4/1994 | Jacobowitz et al. .................... | 333/260 |

OTHER PUBLICATIONS

IBM Technical Disclosure Bulletin, vol. 20, No. 10, Mar. 1978, "Semiconductor Encapsulation", Magdo.
IBM Technical Disclosure Bulletin, vol. 27, No. 4A, Sep. 1984, "Heat Sink For Thermal Conduction Module", Gruber et al.

Primary Examiner—Larry I. Schwartz
Assistant Examiner—Adrian L. Coley
Attorney, Agent, or Firm—Peter W. Peterson; DeLio & Peterson; Aziz M. Ahsan

[57] ABSTRACT

A thermal conduction module comprises a base plate for holding a chip substrate, an integrated circuit chip substrate mounted in the base plate and a cover plate having a surface facing the chip substrate. A movable spacer is secured adjacent to the periphery of the cover plate or the base plate, and is adjustable to a predetermined distance away from the cover plate or base plate. A gap for insertion of a thermally conductive paste may be created between chips mounted on the substrate and the cover plate surface facing the chip substrate by adjustment of the spacer to a desired distance from the cover plate or base plate.

6 Claims, 5 Drawing Sheets

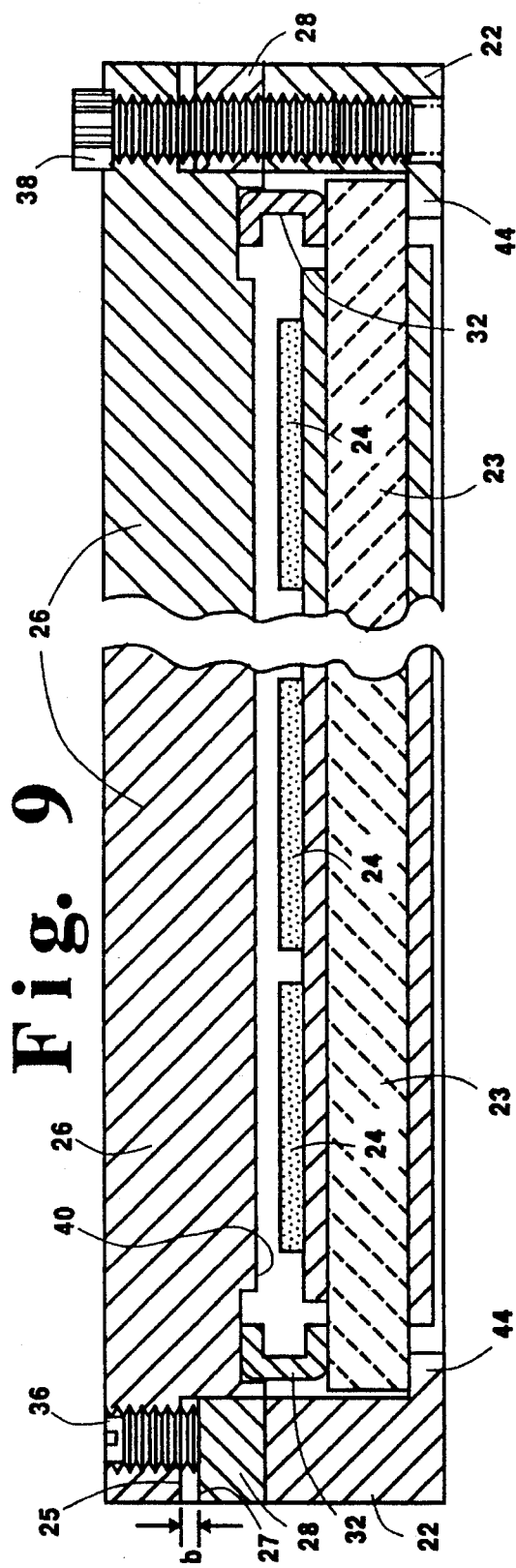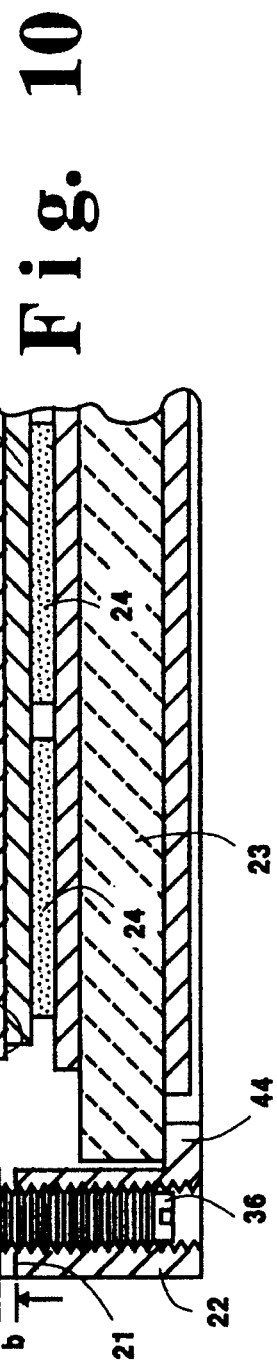

ADJUSTABLE SPACER FOR FLAT PLATE COOLING APPLICATIONS

BACKGROUND OF THE INVENTION

1. Field of the Invention

This invention relates to an apparatus for cooling integrated circuit chips and, in particular, to a thermal conduction module and a method of adjustment and assembly thereof.

2. Description of Related Art

Integrated circuit chips mounted in an array on substrates present special cooling difficulties. While chip size has increased over the years and power usage is more efficient than in the past, work is still needed on cooling systems and methods to remove the relatively high density power dissipated by the chips. The prior art is replete with different types of thermal conduction modules (TCMs) designed to enclose and cool integrated circuit chips mounted on ceramic-glass substrates. In some instances, the TCMs utilize liquid coolants to cool the chips, such as those described in U.S. Pat. Nos. 5,239,200, 5,294,830 and 5,177,667, issued to the assignee of this application. Another approach to cooling has been described in U.S. Pat. No. 4,500,945, also assigned to the assignee of this application, by the use of pistons contacting the chips within the TCMs to remove heat.

A further approach in cooling chips in TCMs has been to utilize a thermally conductive medium, such as high thermal conductivity pastes, between the top of the integrated circuit chip mounted on the substrate and the lower surface of the cover plate facing the substrate. An example of the useful, stable, high solid content, high thermal conductivity paste is disclosed in U.S. Pat. No. 5,098,609. This compound can be applied as a thin film between the top of the chip and the lower surface of the cover of the TCM. In order to properly control the amount of heat removed from the integrated circuit chip, it is desirable to determine a gap of a specified and desired fixed distance between the top of the chip and the lower surface of the cover, and to fill that space completely with the thermally conductive medium such as the aforementioned paste.

Prior art methods of setting the proper gap between the top surface of the chip and the lower surface of the cover have utilized an integral spacer within the thermal conduction module to control size of the gap. This spacer is normally integral with the cover plate and extends around the periphery of the area of the substrate on which the integrated surface chips are mounted.

Glass ceramics which are normally used as substrate materials for the integrated circuit chips are brittle and easy to break, and must be handled with care. The substrates are normally mounted in a base plate of the TCM which encompasses the edges of the substrate. The cover plate is normally secured to this base plate surrounding the substrate following assembly of the TCM. It has been found that the use of the integral spacer in the TCM can contribute to breakage of the glass ceramic substrates when the cover plate is fastened too tightly to the base plate. This has been found to occur because the integral spacer transfers force directly to the substrate when the fasteners, typically screws or bolts around the periphery of the cover plate, are tightened down to the base plate. The substrate, which is contained within the base plate by a lip extending within its periphery, is then subject to excessive and uneven forces from the spacer which may not be in direct line with the lip of the base plate. The application of excessive force to the fasteners will then tend to break the substrates near the lip of the base plates. Because parallelism of the lower surface of the cover plate and the tops of the integrated surface chips must be maintained in all assembled parts, an even distribution force must be applied around the periphery of the thermal conduction module.

Bearing in mind the problems and deficiencies of the prior art, it is therefore an object of the present invention to provide a thermal conduction module which may be assembled with a controlled gap between the lower surface of the cover plate and the upper surface of the integrated circuit chip without causing excessive force and breakage to the chip substrate, whereby a desired thermally conductive medium may be applied between the chip and the cover plate to effect controlled heat removal and cooling of the chip.

It is another object of the present invention to provide a method of assembling a thermal conduction module which reduces the possibility of breakage of the chip substrate while maintaining a controlled gap between the cover plate and the top surface of the integrated circuit chips for insertion of a thermally conductive medium.

A further object of the invention is to provide a thermal conduction module in which the cover plate may be secured to the base plate with higher loading on the fasteners with a reduced possibility of damage to the chip substrate.

It is yet another object of the present invention to provide an apparatus for cooling integrated circuit chips mounted on a substrate by providing an adjustable spacer between the apparatus cover plate and base plate which does not bear directly on the substrate.

Still other objects and advantages of the invention will in part be obvious and will in part be apparent from the specification.

SUMMARY OF THE INVENTION

The aforementioned objects and advantages are achieved in the present invention which relates in one aspect to a thermal conduction module comprising a base plate for holding a chip substrate, the base plate having a periphery; an integrated circuit chip substrate mounted in the base plate and a plurality of integrated circuit chips mounted on the substrate. A cover plate having a periphery and a surface facing the chip substrate is provided. A movable spacer is adjustably secured adjacent to the periphery of the cover plate or the base plate, the spacer being adjustable to a predetermined distance away from the cover plate or base plate. Means are provided for securing the cover plate to the base plate, whereby a gap may be created between the substrate or the chips mounted on the substrate and the cover plate surface facing the chip substrate by adjustment of the spacer to a desired distance from the cover plate or base plate. A thermally conductive medium may be disposed in the gap between the upper surface of the chip and the cover plate surface facing the chip.

In another aspect, the present invention relates to an apparatus for cooling a plurality of integrated circuit chips mounted in a substrate within a base plate. The apparatus includes a cover plate for containing a means for cooling a plurality of integrated circuit chips, the cover plate having a surface facing the substrate and integrated circuit chips. A spacer is disposed adjacent to the cover plate and is positionable between a portion of the cover plate and base plate, the spacer being adjustable to a predetermined fixed distance from the cover plate. Means are provided for securing the cover plate to the base plate. A gap may be created between the substrate or a top surface of an integrated circuit chip mounted in the substrate and the cover plate surface facing the substrate by adjustment of the spacer to a desired fixed distance from the cover plate so that the cooling means may be inserted between the chip top surface and the cover plate surface facing the chip.

In a further aspect, the present invention relates to an apparatus for cooling a plurality of integrated circuit chips mounted in a substrate within a base plate. A base plate receives the substrate and a plurality of integrated circuit chips. A cover plate contains a means for cooling the integrated circuit chips, with the cover plate having a surface facing the substrate and integrated circuit chips. A spacer is provided adjacent to the base plate and is positionable between a portion of the base plate and cover plate, with the spacer being adjustable to a predetermined fixed distance from the base plate. Means are provided for securing the cover plate to the base plate. A gap may be created between the substrate or a top surface of an integrated circuit chip mounted in the substrate and the cover plate surface facing the substrate by adjustment of the spacer to a desired fixed distance from the base plate so that the cooling means may be inserted between the chip top surface and the cover plate surface facing the chip.

In yet another aspect, the present invention relates to a method of assembling a thermal conduction module having a base plate for holding at least one integrated circuit chip mounted on a chip substrate, a cover plate having a surface facing the chip substrate, and a first spacer fastened to the cover plate or base plate, wherein the first spacer is adjustable to a predetermined distance from the cover plate or base plate. The method comprises the steps of placing a substrate on the base plate and, optionally, mounting at least one integrated circuit chip on the substrate. A removable, temporary second spacer is then placed over an upper surface of the substrate and, if present, the integrated circuit chip. The second spacer has a thickness corresponding to a thickness sufficient to permit a thermally conductive medium to be disposed between an upper surface of the integrated circuit chip, when located on the chip substrate, and the cover plate surface facing the chip substrate, when the second spacer is removed. The cover plate is then placed over the second spacer, the integrated circuit chip, if present, the substrate and the base plate. The first spacer is adjusted toward or away from the cover plate or base plate until the first spacer contacts the base plate or cover plate and the cover plate surface contacts the second spacer. This then creates a desired distance for later insertion of a thermally conductive medium between an upper surface of an integrated circuit chip mounted on the chip substrate and the cover plate surface facing the chip substrate. The cover plate is subsequently removed from the second spacer, the substrate, the integrated circuit chip, if present, and the base plate, and the second spacer is removed from over the substrate. Finally, the cover plate is placed over the substrate and the base plate and the cover plate is secured to the base plate, such that a desired gap is created for a thermally conductive medium between an upper surface of an integrated circuit chip and the cover plate surface facing the chip substrate.

In the preferred embodiment, the first spacer is adjustably secured to the cover plate of the thermal conduction module apparatus.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 9 is a side elevational view of a thermal conduction module after adjustment and assembly.

FIG. 10 is a side elevational view of an alternate embodiment of the thermal conduction module after adjustment of the plate spacer and prior to assembly.

DESCRIPTION OF THE PREFERRED EMBODIMENTS

Figure 1:
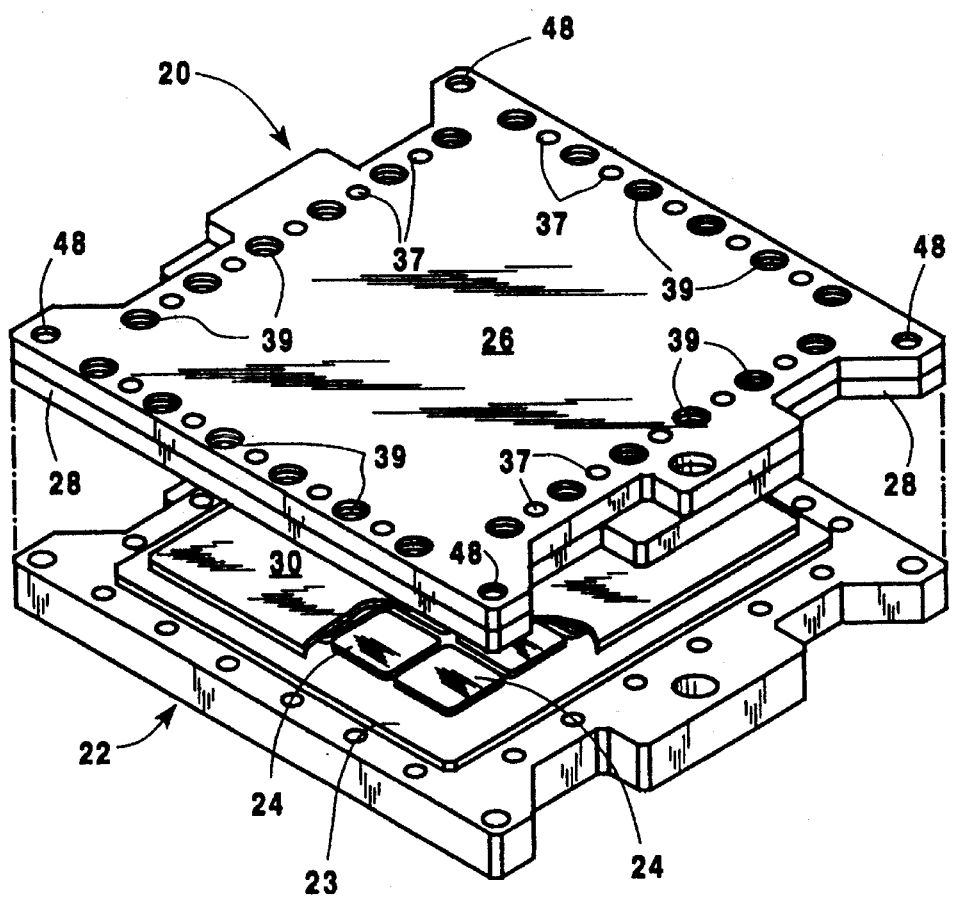
FIG. 1 is a perspective, partially cut-away, view of a thermal conduction module prior to adjustment and assembly.

In describing the preferred embodiment of the present invention, reference will be made herein to FIGS. 1–10 of the drawings in which like numerals refer to like features of the invention. Features of the invention are not necessarily shown to scale in the drawings.

In FIG. 1, there is shown a preferred embodiment of the invention which comprises a single unit, flat plate thermal conduction module 20 which comprises cover plate 26, base plate 22, and adjustable spacer plate 28 which is mounted beneath a portion of the periphery of cover plate 26. Within TCM 20 there is disposed integrated circuit chip substrate 23 which rests within the surrounding base plate 22. Removable chip spacer 30, which will be explained further below, is partially cut away at the nearest corner in order to show the layout of integrated circuit chips 24 mounted on the top surface of glass ceramic substrate 23. The integrated circuit chips 24 are arranged in an array, such as a 5×5 array, on the top surface of substrate 23. Chips 24 are electrically connected to the substrate by a plurality of connections (not shown), which is well known in the art as "flip chip" packaging. The lower surface of the substrate 23 may contain connectors (not shown) for connection of the module to a circuit board within a mainframe computer.

In accordance with the present invention, chip spacer 30 is intended for temporary mounting within the TCM in order to adjust plate spacer 28, and is removable therefrom prior to final assembly and sealing of the TCM. Preferably the chip spacer is made from sheet metal of the desired thickness, and conforms to the area of the array of integrated circuit chips mounted on the substrate within the base plate.

Figure 2:
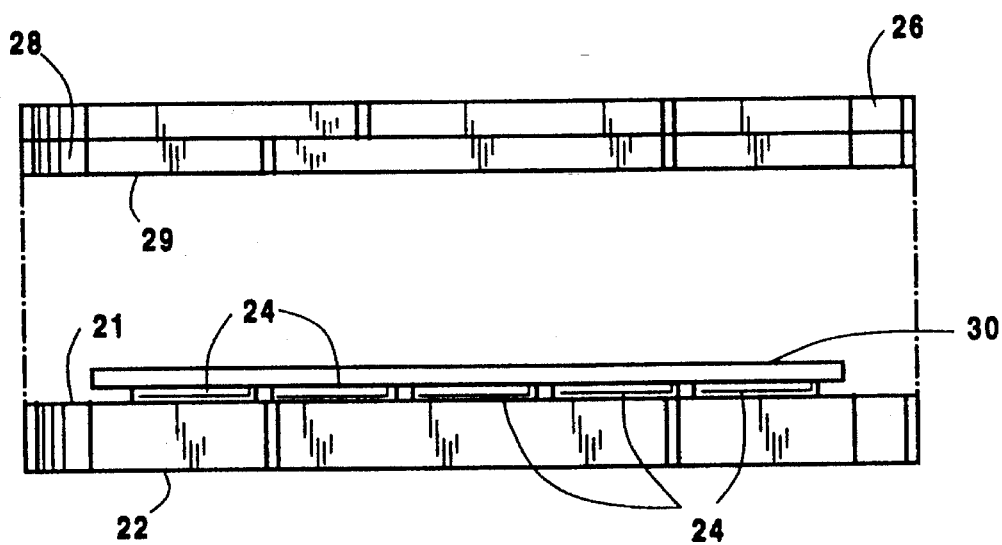
FIG. 2 is a side view of a thermal conduction module prior to adjustment and assembly.

Turning to the side view in FIG. 2, in one embodiment removable chip spacer 30 is disposed on the upper surfaces of integrated circuit chips 24 prior to assembly of cover plate 26 to base plate 22. The purpose of chip spacer 30 is to provide a measurement and guide to establish the desired gap between the top surfaces of chips 24 and the planar lower surface of cover plate 26 in order to achieve the proper film thickness for a thermally conductive medium to remove and transfer heat from the chips to the cover plate. To assemble the TCM, either for initial adjustment of plate spacer 28 or for final assembly, cover plate 26 is lowered onto base plate 22 so that the lower surface 29 of plate spacer 28 contacts the upper surface 21 of the base plate.

Figure 4:
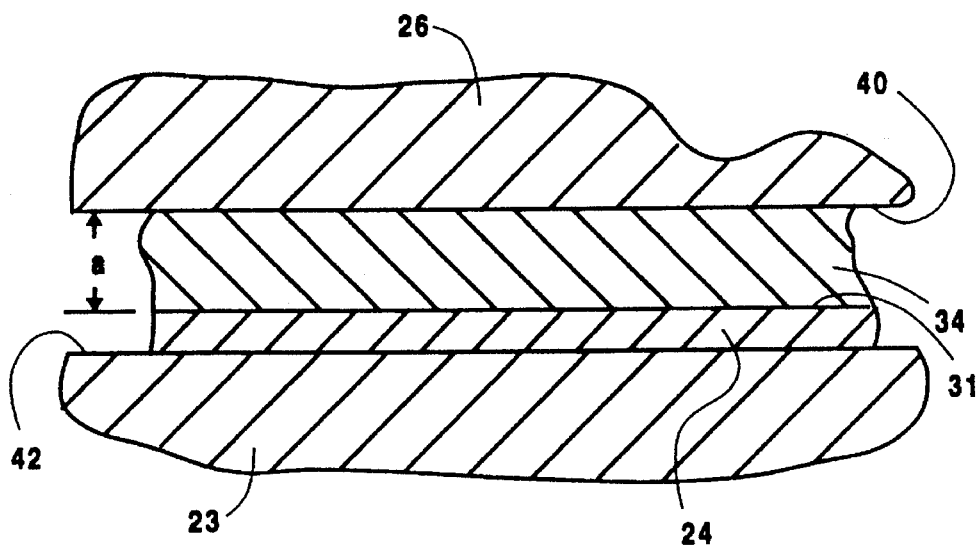
FIG. 4 is a side elevational view of a portion of the thermal conduction module after adjustment and assembly.

As shown in FIG. 4, integrated circuit chip 24 is mounted on substrate planar upper surface 42. After assembly of the preferred TCM of the present invention, thermally conductive medium 34 is provided in the form of a thin film or layer extending completely between the top surface 31 of chip 24 and the lower surface 40 of cover plate 26. The preferred thermally conductive medium is a paste such as that disclosed in the aforementioned U.S. Pat. No. 5,098,609, the disclosure of which is hereby incorporated by reference. As taught in the '609 patent, the preferred thermally conductive paste is also highly electrically resistive. The thickness "a" of the thermally conductive medium 34 shown in FIG. 4 is preestablished by design in order to optimize the heat dissipated by chip 24 during operation.

Figure 3:
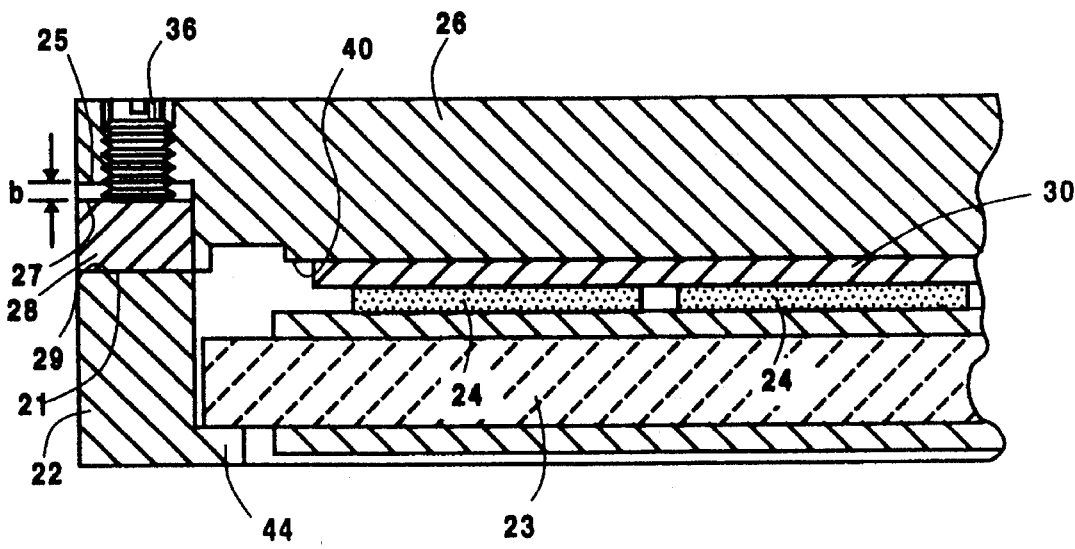
FIG. 3 is a side elevational view of a thermal conduction module after adjustment of the plate spacer and prior to assembly.

In the side elevational view in FIG. 3, the outer peripheral edge of substrate 23 rests on a lip 44 extending inward from base plate 22. Chip spacer 30 is shown resting on top of chips 24 and is disposed below cover plate 26. Chip spacer 30 preferably covers an area greater than the area of the array of chips 24 and an area less than that of substrate 23, but modifications may be made to such area within the design constraints of the particular TCM. Plate spacer 28 is positioned beneath the outer peripheral edge of cover plate 26 and is located so that it is above the peripheral edge of base plate 22 when cover plate 26 is set down on base plate 22. Adjusting means such as adjusting set screw 36 within threaded screw holes 37 are set around the peripheral edge of cover 26 (FIG. 1). To establish the correct adjustment of plate spacer 28, cover plate 26 is placed over base plate 22 and set screw 36 is rotated to move the cover plate either up or down to change the distance "b" between the lower peripheral surface 25 of cover plate 26 and the upper surface 27 of plate spacer 28. The adjustment is considered properly made when there is simultaneous contact between (1) lower surface 29 of plate spacer 28 and upper surface 21 of base plate 22, and (2) lower surface 40 of cover plate 26, chip spacer 30, and the upper surface 31 of integrated circuit chips 24. Such simultaneous contact should exist around the entire periphery of base plate 22 as well as along all of the top surfaces of integrated chips 24.

Accordingly, in order to obtain a proper adjustment for the thickness "a" of thermally conductive medium (FIG. 4), suitable spacing b will be provided between cover plate periphery 25 and plate spacer 28. Distance b will be proportional to distance a.

Figure 6:
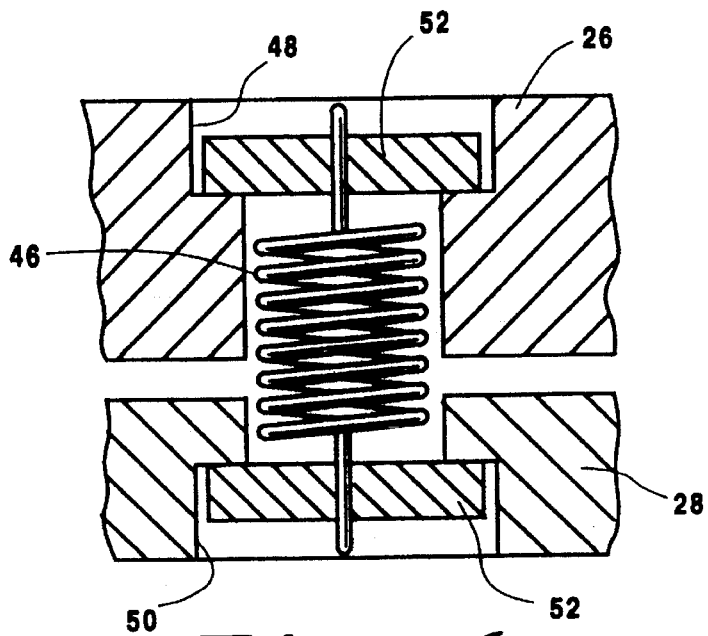
FIG. 6 is a side elevational view of a portion of the thermal conduction module.
Figure 7:
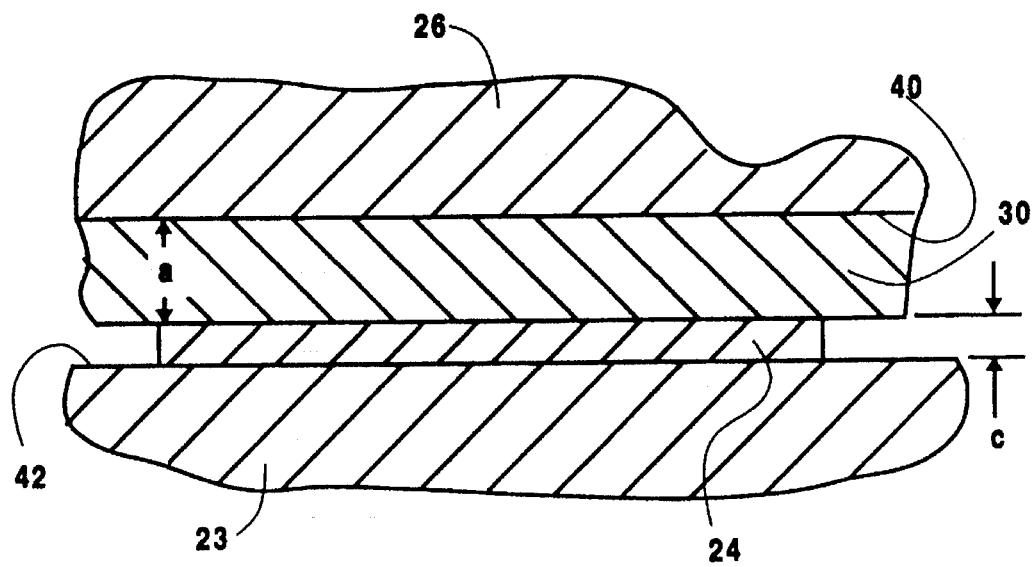
FIG. 7 is a side elevational view of a thermal conduction module during adjustment utilizing one embodiment of the invention.

In order to securely hold plate spacer 28 to the periphery of cover plate 26 while still maintaining the ability to adjust spacing b between the two, suitable securing means may be employed such as that depicted in FIG. 6. Openings 48 and 50 are disposed at the corners of cover plate 26 and plate spacer 28, respectively (FIG. 1). Within each hole 48 is a spring retainer 52, which abuts a ledge in the hole, and spring 46, which is secured at its ends by the spring retainers to hold and urge the cover plate 26 and plate spacer 28 together.

Figure 5:
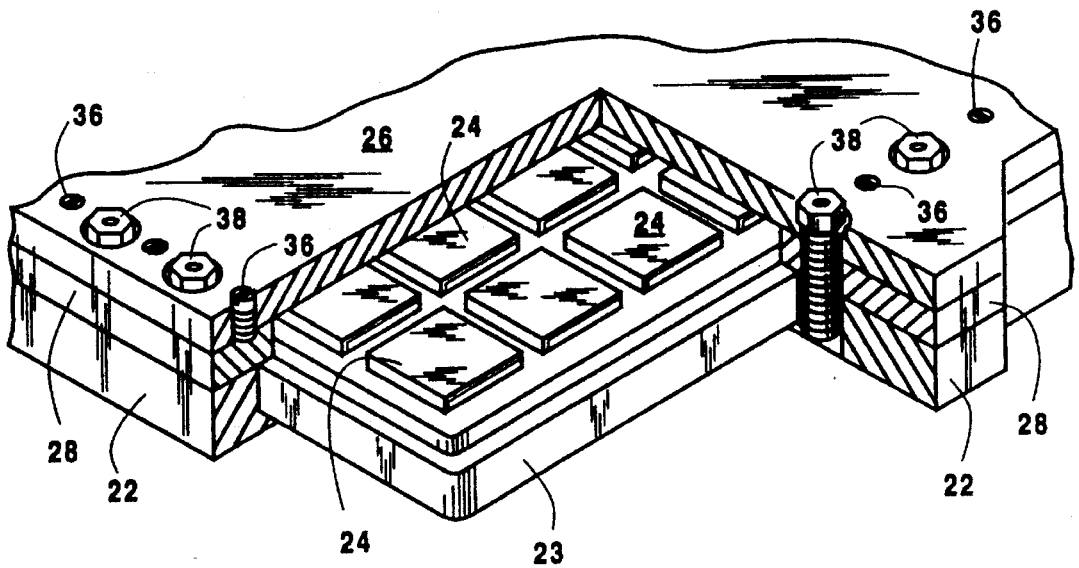
FIG. 5 is a perspective, partially cut-away, view of a portion of the thermal conduction module after adjustment and assembly.

Following adjustment of plate spacer 28, cover plate 26 is removed from base plate 22 and chip spacer 30 is then removed from its position over the chips 24. Prior to resetting the cover plate, C-ring 32 (FIG. 9) may be placed within the base plate around the periphery of the chip array between the substrate and the cover plate lower surface 40 in order to provide a seal for the thermally conductive medium within the TCM. The thermally conductive medium is placed within the TCM over the chips before assembly of the cover plate to the base plate. Without modifying the adjustments made to plate spacer 28, cover plate 26 is then re-set over base plate 22. As shown in FIGS. 5 and 9, fastening means such as securing bolts 38 are inserted into the corresponding holes 39 set around the periphery cover plate to secure the cover plate to and over the base plate. The base plate is then secured to either the cover plate 26, spacer plate 28, or both, in order to seal the TCM.

Because the present invention provides an adjustable plate spacer in line between the cover plate 26 and base plate 22 at the position of the compressive securing forces, there is no excessive force placed on the substrate, for example, by the prior art integral-cover spacers, which may cause damage or breakage to the substrate. Furthermore, the method of adjusting the spacer as provided herein maintains a desired uniform gap between the integrated circuit chips and the cover plate for insertion of the thermally conductive medium.

Figure 8:
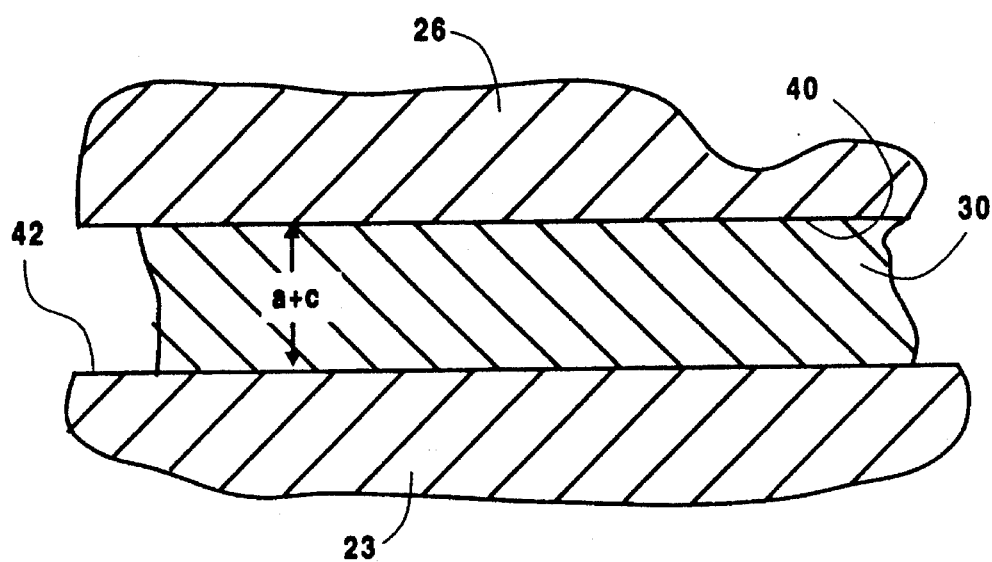
FIG. 8 is a side elevational view of a thermal conduction module during adjustment utilizing another embodiment of the invention.

The adjustment of plate spacer 28 has been described above with reference to a base plate having a substrate in which the chips were already mounted therein. In an alternative embodiment, the proper spacing adjustment may be made prior to mounting of the integrated circuit chips on the substrate. In such case, the thickness of chip spacer 30 should equal the sum of the desired thickness of the thermally conductive medium "a" and the thickness of integrated circuit chip "c", as shown in FIG. 8. In this manner, chip spacer 30 is placed over substrate 23 prior to mounting of the chips, the adjustment to plate spacer 28 and distance b is made, the cover plate is removed, the chips are then mounted on the substrate, the thermally conductive medium is applied, and the cover plate replaced and secured to the base plate.

In another embodiment of the present invention depicted in FIG. 10, plate spacer 28 may be adjustably secured to base plate 22 instead of being adjustably secured to cover plate 26. The plate spacer is secured to the base plate in the same manner as previously discussed in connection with the cover plate, including the preferred adjusting set screws (30) and spring retainers. The method of adjusting the plate spacer 28 and distance "b" between the plate spacer lower surface 29 and base plate upper surface 21 is analogous in all regards to the method defined previously.

The above invention achieves the objects recited above. The cover plate may be tightened by screws to a much higher force to the base plate than under the prior art because the plate spacer is now designed to absorb the load in a linear arrangement along the fastening bolts. No damage to the substrate will occur by this method and apparatus.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of assembling a thermal conduction module having a base plate for holding at least one integrated circuit chip mounted on a chip substrate; a cover plate having a surface facing the chip substrate, and a first spacer fastened to the cover plate or base plate, said first spacer being adjustable to a predetermined distance from the cover plate or base plate, said method comprising the steps of:

a) placing a substrate on the base plate;

b) optionally placing at least one integrated circuit chip on the substrate;

c) placing a removable, temporary second spacer over an upper surface of the substrate and, if present, the integrated circuit chip, said second spacer having a thickness corresponding to a thickness sufficient to permit a thermally conductive medium to be disposed between an upper surface of the integrated circuit chip, when located on the chip substrate, and the cover plate surface facing the chip substrate, when the second spacer is removed;

d) placing the cover plate over the second spacer, the integrated circuit chip, if present, the substrate and the base plate;

e) adjusting the first spacer toward or away from the cover plate or base plate, until the first spacer contacts the base plate or cover plate and the cover plate surface contacts the second spacer, to create a desired distance for insertion of a thermally conductive medium between an upper surface of an integrated circuit chip mounted on the chip substrate and the cover plate surface facing the chip substrate;

f) removing the cover plate from the second spacer, the substrate, the integrated circuit chip, if present, and the base plate;

g) removing the second spacer from over the substrate;

h) replacing the cover plate over the substrate and the base plate; and i) securing the cover plate to the base plate, whereby a desired gap is created for a thermally conductive medium between an upper surface of an integrated circuit chip and the cover plate surface facing the chip substrate.

2. The method of claim 1 wherein the first spacer is secured to the cover plate, and step (e) comprises adjusting the first spacer toward or away from the cover plate until the first spacer contacts the base plate and the cover plate surface contacts the second spacer.

3. The method of claim 1 wherein the first spacer is secured to the base plate, and step (e) comprises adjusting the first spacer toward or away from the base plate until the first spacer contacts the cover plate and the cover plate surface contacts the second spacer.

4. The method of claim 1 further comprising, between steps (g) and (h), the step of inserting a thermally conductive medium between an upper surface of the integrated circuit chip and the cover plate surface facing the chip substrate.

5. The method of claim 1 wherein said step (i) comprises bolting the cover plate or first spacer to the base plate.

6. The method of claim 1 wherein said step (e) comprises adjusting the first spacer toward or away from the cover plate or base plate at a plurality of positions around the periphery of the cover plate or base plate.

* * * * *